United States Patent
Tan

(10) Patent No.: US 10,008,094 B2
(45) Date of Patent: Jun. 26, 2018

(54) ELECTRIC METER APPARATUS WITH LIGHT-BLINKING FUNCTION

(71) Applicant: BRYMEN TECHNOLOGY CORPORATION, New Taipei (TW)

(72) Inventor: Po-Chao Tan, New Taipei (TW)

(73) Assignee: BRYMEN TECHNOLOGY CORPORATION, New Taipei (TW)

(*) Notice: Subject to any disclaimer, the term of this patent is extended or adjusted under 35 U.S.C. 154(b) by 0 days. days.

(21) Appl. No.: 15/684,944

(22) Filed: Aug. 24, 2017

(65) Prior Publication Data
US 2018/0025612 A1   Jan. 25, 2018

Related U.S. Application Data

(63) Continuation of application No. 15/218,235, filed on Jul. 25, 2016, now abandoned.

(51) Int. Cl.
*G08B 21/00* (2006.01)
*G08B 21/18* (2006.01)
(Continued)

(52) U.S. Cl.
CPC ......... *G08B 21/185* (2013.01); *G01R 31/025* (2013.01); *G08B 5/38* (2013.01)

(58) Field of Classification Search
CPC ....... G08B 21/185; G08B 5/38; G01R 31/025
(Continued)

(56) References Cited

U.S. PATENT DOCUMENTS 4,949,274 A * 8/1990 Hollander .......... G01R 31/2834
                                              324/142
7,768,292 B1 * 8/2010 Koch .................... G01R 31/40
                                              324/764.01
(Continued)

FOREIGN PATENT DOCUMENTS

CN   203519757 U   4/2014
CN   204789705 U   11/2015
(Continued)

OTHER PUBLICATIONS

Data Sheet CT 20, EXTECH instruments, 2006.
(Continued)

*Primary Examiner* — Kerri McNally
*Assistant Examiner* — Thang Tran
(74) *Attorney, Agent, or Firm* — Chun-Ming Shih; HDLS IPR Services

(57) ABSTRACT

An electric meter apparatus with a light-blinking function includes a positive-side probe, a negative-side probe, a resistor measuring circuit, a voltage supply unit, a micro control unit and a light-blinking indication unit. The resistor measuring circuit is configured to measure an external resistor to obtain a resistance value of the external resistor through the positive-side probe and the negative-side probe. The resistor measuring circuit is configured to inform the micro control unit of the resistance value of the external resistor. If the resistance value of the external resistor is less than or equal to a predetermined value, the micro control unit is configured to control the light-blinking indication unit to light, to be turned off or to light blinkingly, in order to remind the user.

13 Claims, 10 Drawing Sheets

(51) Int. Cl.
*G01R 31/02* (2006.01)
*G08B 5/38* (2006.01)

(58) Field of Classification Search
USPC .......................................................... 340/650
See application file for complete search history.

(56) References Cited

U.S. PATENT DOCUMENTS

| | | | | |
|---|---|---|---|---|
| 9,551,597 | B2* | 1/2017 | Epperson | ................. G01D 5/39 |
| 9,739,801 | B2* | 8/2017 | Anderson | ................. G01R 1/30 |
| 2003/0164770 | A1* | 9/2003 | Edge | ...................... G01R 27/14 |
| | | | | 340/635 |
| 2007/0200573 | A1* | 8/2007 | Chen | ...................... G01R 15/12 |
| | | | | 324/116 |
| 2008/0154602 | A1* | 6/2008 | Hollander | ................ G01D 7/12 |
| | | | | 704/251 |
| 2009/0128127 | A1* | 5/2009 | Garland | ............... G01R 15/125 |
| | | | | 324/115 |
| 2009/0140721 | A1* | 6/2009 | Garland | ............... G01R 15/125 |
| | | | | 324/115 |
| 2009/0256576 | A1* | 10/2009 | Weems, II | ........... G01R 31/025 |
| | | | | 324/520 |
| 2014/0267753 | A1* | 9/2014 | Epperson | ................. G01D 5/39 |
| | | | | 348/160 |

FOREIGN PATENT DOCUMENTS

| | | |
|---|---|---|
| TW | M263665 U | 5/2005 |
| TW | M517823 U | 2/2016 |

OTHER PUBLICATIONS

Operating instructions DUTEST pro, Sep. 2014.
Office Action dated Apr. 24, 2017 of the corresponding German patent application of parent US patent application.
Office Action dated Feb. 18, 2017 of the corresponding Taiwan patent application of parent US patent applicaiton.

* cited by examiner

ELECTRIC METER APPARATUS WITH LIGHT-BLINKING FUNCTION

CROSS-REFERENCE TO RELATED APPLICATIONS

This application is a continuation-in part application of U.S. application Ser. No. 15/218,235 filed on Jul. 25, 2016. The entire disclosure is incorporated herein by reference.

BACKGROUND OF THE INVENTION

Field of the Invention

The present invention relates to an electric meter apparatus, and especially relates to an electric meter apparatus with a light-blinking function.

Description of the Related Art

Electric meters and clamp meters are both common electronic measurement apparatuses. The clamp meter measures the current in a conductor (for example, an electric wire) without having to make the electrical connection.

Electric meters and clamp meters have short circuit testing functions to test the short circuit. When the short circuit is measured by the related art electric meter, the related art electric meter will generate sounds to remind the user. However, in a noisy environment, for example, in the factory, the user sometimes is difficult to hear the sounds generated by the related art electric meter.

SUMMARY OF THE INVENTION

In order to solve the above-mentioned problems, a first object of the present invention is to provide an electric meter apparatus with a light-blinking function.

In order to solve the above-mentioned problems, a second object of the present invention is to provide an electric meter apparatus with a light-blinking function.

In order to solve the above-mentioned problems, a third object of the present invention is to provide an electric meter apparatus with a light-blinking function.

In order to achieve the first object of the present invention mentioned above, the electric meter apparatus is applied to an external resistor. The electric meter apparatus includes a positive-side probe, a negative-side probe, a resistor measuring circuit, a voltage supply unit, a micro control unit and a light-blinking indication unit. One side of the positive-side probe is connected to one side of the external resistor. One side of the negative-side probe is connected to the other side of the external resistor. The other side of the negative-side probe is connected to ground. The resistor measuring circuit is connected to the other side of the positive-side probe. The voltage supply unit is connected to the resistor measuring circuit. The micro control unit is connected to the resistor measuring circuit. The light-blinking indication unit is connected to the micro control unit. The resistor measuring circuit is configured to measure the external resistor to obtain a resistance value of the external resistor through the positive-side probe and the negative-side probe. The resistor measuring circuit is configured to inform the micro control unit of the resistance value of the external resistor. A measuring time is defined as a duration that the resistor measuring circuit is configured to measure the external resistor through the positive-side probe and the negative-side probe and the resistance value of the external resistor is less than or equal to a predetermined value. The micro control unit is configured to calculate and determine the measuring time. If the measuring time is less than a predetermined time and the light-blinking indication unit is not lighting, the micro control unit is configured to control the light-blinking indication unit to light in the predetermined time. If the measuring time is less than the predetermined time and the light-blinking indication unit is lighting, the micro control unit is configured to turn off the light-blinking indication unit in the predetermined time. If the measuring time is not less than the predetermined time, the micro control unit is configured to control the light-blinking indication unit to light blinkingly.

Moreover, the electric meter apparatus further comprises a display connected to the micro control unit. The light-blinking indication unit is a backlight module.

Moreover, the light-blinking indication unit is a light emitting diode.

More, the resistor measuring circuit includes a first voltage-dividing resistor, a positive temperature coefficient thermistor unit, a measuring side resistor, a comparator and a reference voltage source. One side of the first voltage-dividing resistor is connected to the voltage supply unit. One side of the positive temperature coefficient thermistor unit is connected to the other side of the first voltage-dividing resistor. The other side of the positive temperature coefficient thermistor unit is connected to the other side of the positive-side probe. One side of the measuring side resistor is connected to the other side of the positive-side probe and the other side of the positive temperature coefficient thermistor unit. The comparator includes a first input side, a second input side and an output side. The first input side is connected to the other side of the measuring side resistor. The second input side is connected to the reference voltage source. The output side is connected to the micro control unit. If the resistance value of the external resistor is less than or equal to the predetermined value, the comparator is configured to inform the micro control unit that the resistance value of the external resistor is less than or equal to the predetermined value.

In order to achieve the second object of the present invention mentioned above, the electric meter apparatus is applied to an external resistor. The electric meter apparatus includes a positive-side probe, a negative-side probe, a resistor measuring circuit, a voltage supply unit, a micro control unit, a light-blinking indication unit and a sound indication unit. One side of the positive-side probe is connected to one side of the external resistor. One side of the negative-side probe is connected to the other side of the external resistor. The other side of the negative-side probe is connected to ground. The resistor measuring circuit is connected to the other side of the positive-side probe. The voltage supply unit is connected to the resistor measuring circuit. The micro control unit is connected to the resistor measuring circuit. The light-blinking indication unit is connected to the micro control unit. The sound indication unit is connected to the micro control unit. The resistor measuring circuit is configured to measure the external resistor to obtain a resistance value of the external resistor through the positive-side probe and the negative-side probe. The resistor measuring circuit is configured to inform the micro control unit of the resistance value of the external resistor. A measuring time is defined as a duration that the resistor measuring circuit is configured to measure the external resistor through the positive-side probe and the negative-side probe and the resistance value of the external resistor is less than or equal to a predetermined value. The micro control unit is configured to calculate and determine the measuring time. If the measuring time is less than a predetermined time and the light-blinking indication unit is not lighting, the micro control unit is configured to control the light-blinking indication unit to light and the micro control unit is configured to control the sound indication unit to generate sounds simultaneously in the predetermined time. If the measuring time is less than the predetermined time and the light-blinking indication unit is lighting, the micro control unit is configured to turn off the light-blinking indication unit and the micro control unit is configured to control the sound indication unit to generate the sounds simultaneously in the predetermined time. If the measuring time is not less than the predetermined time, the micro control unit is configured to control the light-blinking indication unit to light blinkingly and the micro control unit is configured to control the sound indication unit to generate the sounds simultaneously.

Moreover, the electric meter apparatus further comprises a display connected to the micro control unit. The light-blinking indication unit is a backlight module.

Moreover, the light-blinking indication unit is a light emitting diode.

Moreover, the sound indication unit is a buzzer.

More, the resistor measuring circuit includes a first voltage-dividing resistor, a positive temperature coefficient thermistor unit, a measuring side resistor, a comparator and a reference voltage source. One side of the first voltage-dividing resistor is connected to the voltage supply unit. One side of the positive temperature coefficient thermistor unit is connected to the other side of the first voltage-dividing resistor. The other side of the positive temperature coefficient thermistor unit is connected to the other side of the positive-side probe. One side of the measuring side resistor is connected to the other side of the positive-side probe and the other side of the positive temperature coefficient thermistor unit. The comparator includes a first input side, a second input side and an output side. The first input side is connected to the other side of the measuring side resistor. The second input side is connected to the reference voltage source. The output side is connected to the micro control unit. If the resistance value of the external resistor is less than or equal to the predetermined value, the comparator is configured to inform the micro control unit that the resistance value of the external resistor is less than or equal to the predetermined value.

In order to achieve the third object of the present invention mentioned above, the electric meter apparatus is applied to an external resistor. The electric meter apparatus includes a positive-side probe, a negative-side probe, a resistor measuring circuit, a voltage supply unit, a micro control unit, a backlight module and a sound indication unit. One side of the positive-side probe is connected to one side of the external resistor. One side of the negative-side probe is connected to the other side of the external resistor. The other side of the negative-side probe is connected to ground. The resistor measuring circuit is connected to the other side of the positive-side probe. The voltage supply unit is connected to the resistor measuring circuit. The micro control unit is connected to the resistor measuring circuit. The backlight module is connected to the micro control unit. The sound indication unit is connected to the micro control unit. The resistor measuring circuit is configured to measure the external resistor to obtain a resistance value of the external resistor through the positive-side probe and the negative-side probe. The resistor measuring circuit is configured to inform the micro control unit of the resistance value of the external resistor. A measuring time is defined as a duration that the resistor measuring circuit is configured to measure the external resistor through the positive-side probe and the negative-side probe and the resistance value of the external resistor is less than or equal to a predetermined value. The micro control unit is configured to calculate and determine the measuring time. If the measuring time is less than a predetermined time and the backlight module is not lighting, the micro control unit is configured to control the backlight module to light and the micro control unit is configured to control the sound indication unit to generate sounds simultaneously in the predetermined time. If the measuring time is less than the predetermined time and the backlight module is lighting, the micro control unit is configured to turn off the backlight module and the micro control unit is configured to control the sound indication unit to generate the sounds simultaneously in the predetermined time. If the measuring time is not less than the predetermined time, the micro control unit is configured to control the backlight module to light blinkingly and the micro control unit is configured to control the sound indication unit to generate the sounds simultaneously.

Moreover, the electric meter apparatus further comprises a display connected to the micro control unit.

Moreover, the sound indication unit is a buzzer.

More, the resistor measuring circuit includes a first voltage-dividing resistor, a positive temperature coefficient thermistor unit, a measuring side resistor, a comparator and a reference voltage source. One side of the first voltage-dividing resistor is connected to the voltage supply unit. One side of the positive temperature coefficient thermistor unit is connected to the other side of the first voltage-dividing resistor. The other side of the positive temperature coefficient thermistor unit is connected to the other side of the positive-side probe. One side of the measuring side resistor is connected to the other side of the positive-side probe and the other side of the positive temperature coefficient thermistor unit. The comparator includes a first input side, a second input side and an output side. The first input side is connected to the other side of the measuring side resistor. The second input side is connected to the reference voltage source. The output side is connected to the micro control unit. If the resistance value of the external resistor is less than or equal to the predetermined value, the comparator is configured to inform the micro control unit that the resistance value of the external resistor is less than or equal to the predetermined value.

The advantage of the present invention is that when the short circuit is measured by the electric meter, the backlight module or the light emitting diode of the electric meter will light blinkingly to remind the user.

DETAILED DESCRIPTION OF THE INVENTION

Please refer to following detailed description and figures for the technical content of the present invention. The following detailed description and figures are referred for the present invention, but the present invention is not limited to it.

Figure 1:
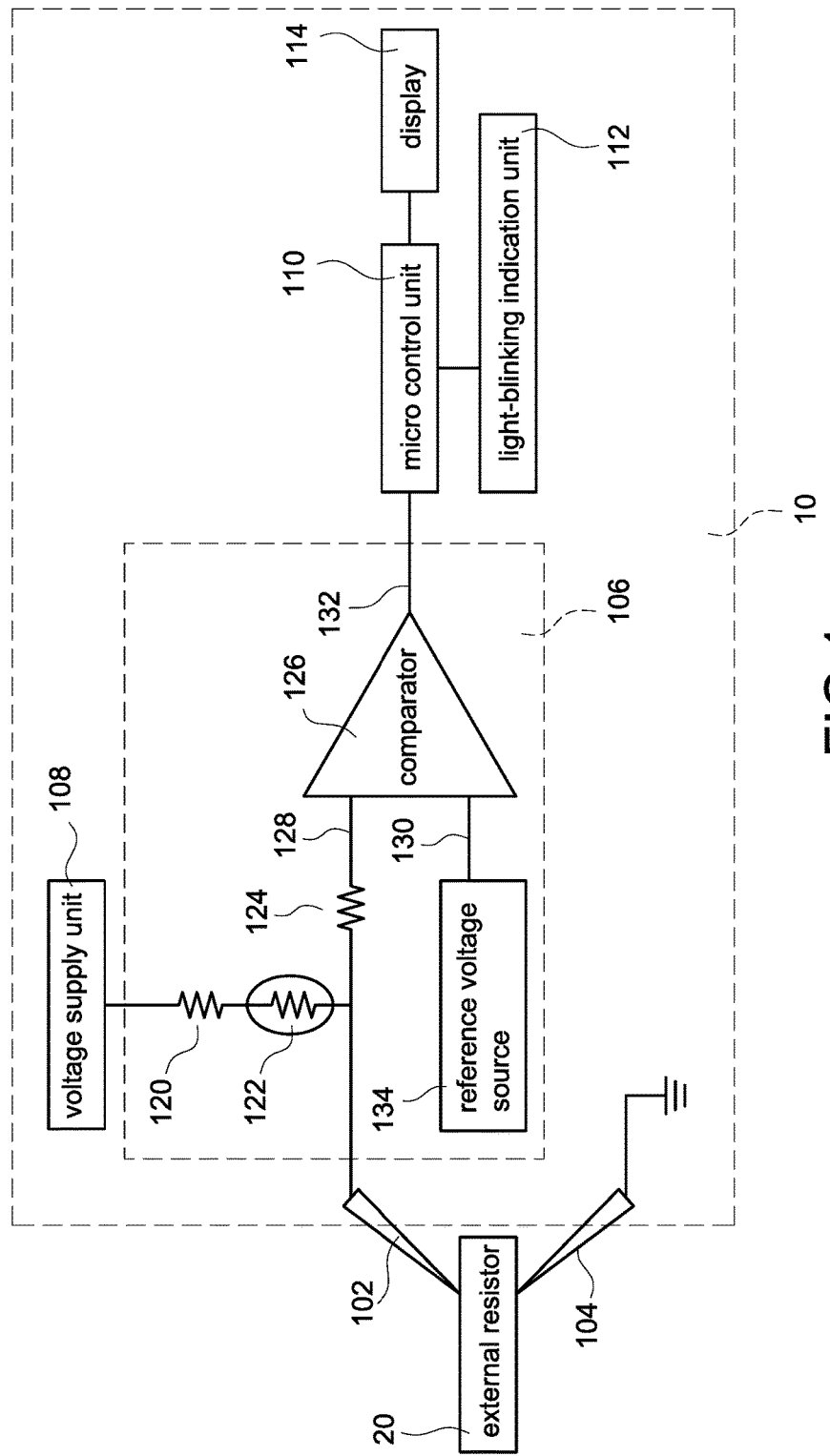
FIG. 1 shows a block diagram of the first embodiment of the electric meter apparatus with a light-blinking function of the present invention.

FIG. 1 shows a block diagram of the first embodiment of the electric meter apparatus with a light-blinking function of the present invention. An electric meter apparatus 10 with a light-blinking function is applied to an external resistor 20. The electric meter apparatus 10 includes a positive-side probe 102, a negative-side probe 104, a resistor measuring circuit 106, a voltage supply unit 108, a micro control unit 110, a light-blinking indication unit 112 and a display 114. The resistor measuring circuit 106 includes a first voltage-dividing resistor 120, a PTC thermistor unit 122, a measuring side resistor 124, a comparator 126 and a reference voltage source 134. The comparator 126 includes a first input side 128, a second input side 130 and an output side 132. The PTC is the abbreviation of the positive temperature coefficient.

One side of the positive-side probe 102 is connected to one side of the external resistor 20. One side of the negative-side probe 104 is connected to the other side of the external resistor 20. The other side of the negative-side probe 104 is connected to ground. The resistor measuring circuit 106 is connected to the other side of the positive-side probe 102. The voltage supply unit 108 is connected to the resistor measuring circuit 106. The micro control unit 110 is connected to the resistor measuring circuit 106. The light-blinking indication unit 112 is connected to the micro control unit 110. The display 114 is connected to the micro control unit 110. One side of the first voltage-dividing resistor 120 is connected to the voltage supply unit 108. One side of the PTC thermistor unit 122 is connected to the other side of the first voltage-dividing resistor 120. The other side of the PTC thermistor unit 122 is connected to the other side of the positive-side probe 102. One side of the measuring side resistor 124 is connected to the other side of the positive-side probe 102 and the other side of the PTC thermistor unit 122. The first input side 128 of the comparator 126 is connected to the other side of the measuring side resistor 124. The output side 132 of the comparator 126 is connected to the micro control unit 110. The reference voltage source 134 is connected to the second input side 130 of the comparator 126.

The resistor measuring circuit 106 is configured to measure the external resistor 20 to obtain a resistance value of the external resistor 20 through the positive-side probe 102 and the negative-side probe 104. The resistor measuring circuit 106 is configured to inform the micro control unit 110 of the resistance value of the external resistor 20. In another word, if the resistance value of the external resistor 20 is less than or equal to a predetermined value, the comparator 126 is configured to inform the micro control unit 110 that the resistance value of the external resistor 20 is less than or equal to the predetermined value. The predetermined value is, for example but not limited to, 0.1 ohm or 0.5 ohm. The electric meter apparatus 10 is, for example but not limited to, an electric meter or a clamp meter.

Figure 7:
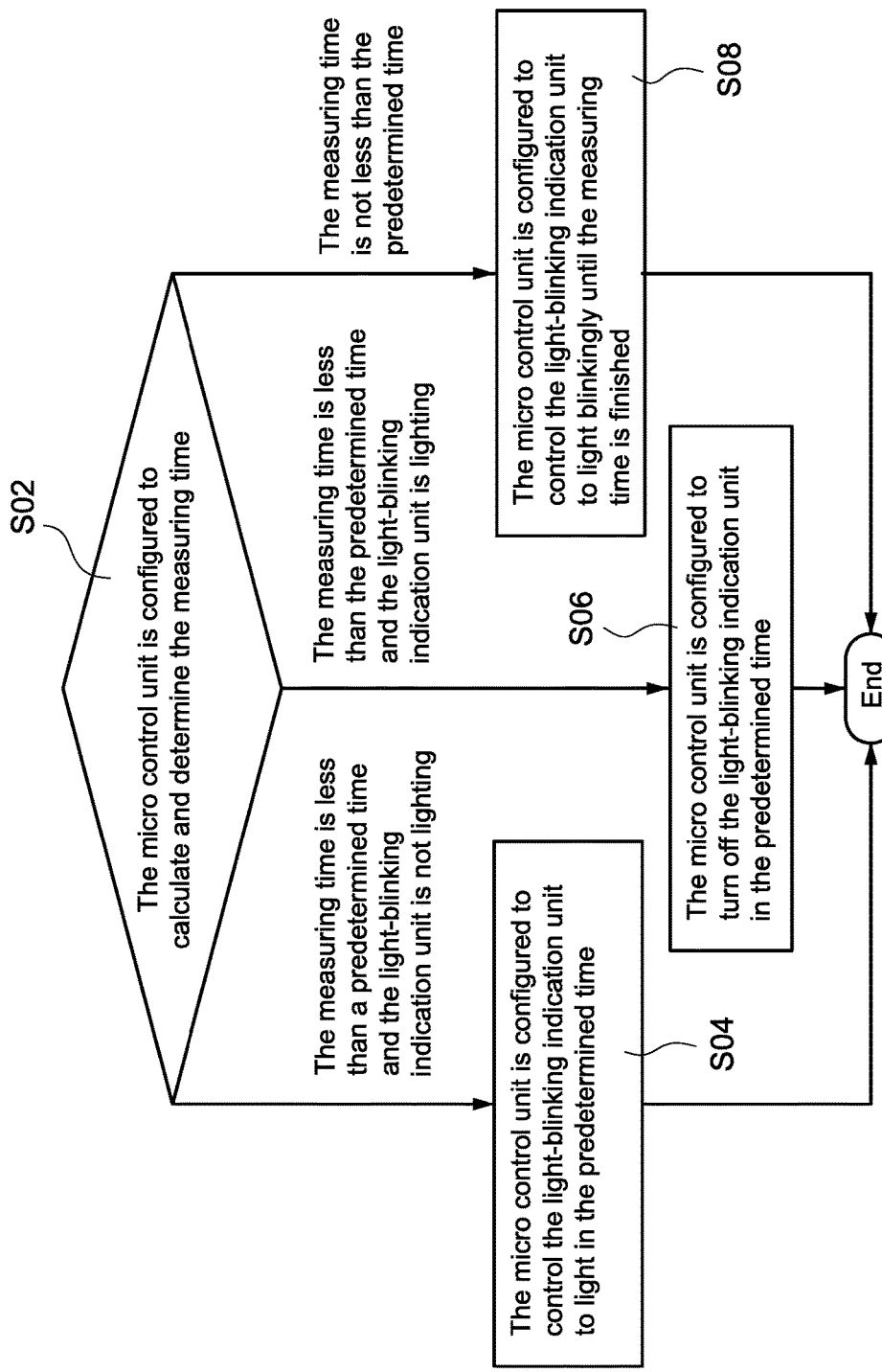
FIG. 7 shows a flow chart of the first embodiment of the measuring method applied to the electric meter apparatus with a light-blinking function of the present invention.

FIG. 7 shows a flow chart of the first embodiment of the measuring method applied to the electric meter apparatus with a light-blinking function of the present invention. Moreover, in an embodiment of the present invention, a measuring time is defined as a duration that the resistor measuring circuit 106 is configured to measure the external resistor 20 through the positive-side probe 102 and the negative-side probe 104 and the resistance value of the external resistor 20 is less than or equal to a predetermined value. As shown in FIG. 7, the measuring method applied to the electric meter apparatus of the present invention comprises following steps:

Step S02: The micro control unit 110 is configured to calculate and determine the measuring time. If the measuring time is less than a predetermined time (for example, one second) and the light-blinking indication unit 112 is not lighting, the measuring method goes to a step S04. If the measuring time is less than the predetermined time and the light-blinking indication unit 112 is lighting, the measuring method goes to a step S06. If the measuring time is not less than the predetermined time, the measuring method goes to a step S08.

Step S04: The micro control unit 110 is configured to control the light-blinking indication unit 112 to light in the predetermined time. Then the measuring method is finished.

Step S06: The micro control unit 110 is configured to turn off the light-blinking indication unit 112 in the predetermined time. Then the measuring method is finished.

Step S08: The micro control unit 110 is configured to control the light-blinking indication unit 112 to light blinkingly until the measuring time is finished. Then the measuring method is finished.

For example, the duration for the resistor measuring circuit 106 measuring the short circuit through the positive-side probe 102 and the negative-side probe 104 is 0.5 second, and then the resistor measuring circuit 106 stops measuring the short circuit through the positive-side probe 102 and the negative-side probe 104 (namely, the measuring time mentioned above is 0.5 second): If the light-blinking indication unit 112 is not lighting, the micro control unit 110 is configured to control the light-blinking indication unit 112 to light in 0.5 second, and then the micro control unit 110 is configured to turn off the light-blinking indication unit 112. If the light-blinking indication unit 112 is lighting, the micro control unit 110 is configured to turn off the light-blinking indication unit 112 in 0.5 second, and then the micro control unit 110 is configured to control the light-blinking indication unit 112 to light.

For example, the duration for the resistor measuring circuit 106 measuring the short circuit through the positive-side probe 102 and the negative-side probe 104 is 5 seconds, and then the resistor measuring circuit 106 stops measuring the short circuit through the positive-side probe 102 and the negative-side probe 104 (namely, the measuring time mentioned above is 5 seconds): If the light-blinking indication unit 112 is not lighting, the micro control unit 110 is configured to control the light-blinking indication unit 112 to light in the first second, and then the micro control unit 110 is configured to control the light-blinking indication unit 112 to light blinkingly in the second to fifth seconds, and then the micro control unit 110 is configured to turn off the light-blinking indication unit 112 after the fifth second. If the light-blinking indication unit 112 is lighting, the micro control unit 110 is configured to turn off the light-blinking indication unit 112 in the first second, and the micro control unit 110 is configured to control the light-blinking indication unit 112 to light blinkingly in the second to fifth seconds, and then the micro control unit 110 is configured to control the light-blinking indication unit 112 to light after the fifth second.

The light-blinking indication unit 112 is a backlight module of the display 114, or the light-blinking indication unit 112 is a light emitting diode arranged on a surface of the electric meter apparatus 10. The PTC thermistor unit 122 is a circuit current limiting protection unit. The voltage supply unit 108 can provide a direct current voltage or an alternating current voltage.

Figure 2:
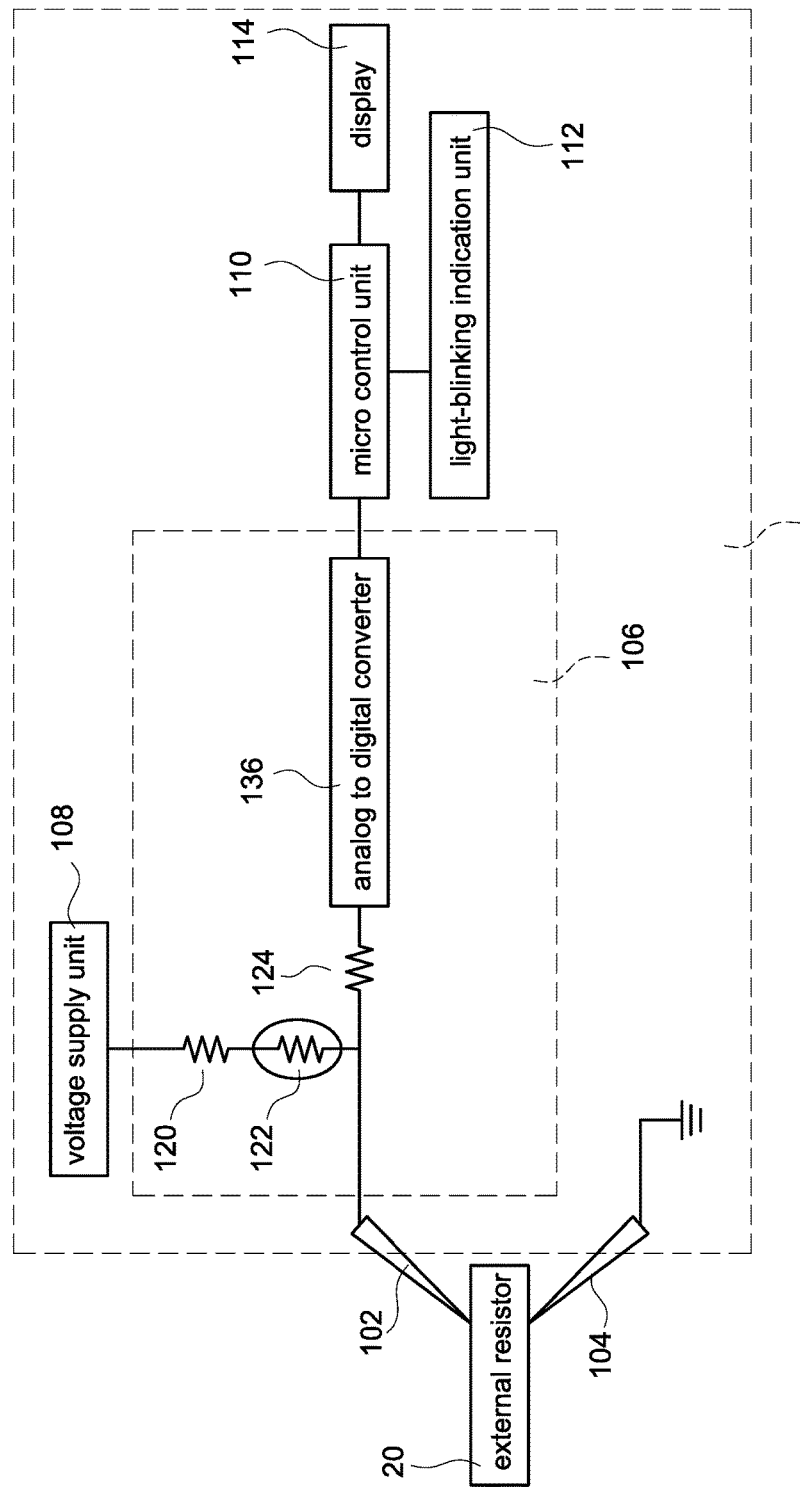
FIG. 2 shows a block diagram of the second embodiment of the electric meter apparatus with a light-blinking function of the present invention.

FIG. 2 shows a block diagram of the second embodiment of the electric meter apparatus with a light-blinking function of the present invention. The description for the elements shown in FIG. 2, which are similar to those shown in FIG. 1, is not repeated here for brevity. Moreover, the resistor measuring circuit 106 further comprises an analog to digital converter 136 connected to the other side of the measuring side resistor 124 and the micro control unit 110. If the resistance value of the external resistor 20 is less than or equal to the predetermined value, the analog to digital converter 136 is configured to inform the micro control unit 110 that the resistance value of the external resistor 20 is less than or equal to the predetermined value.

Figure 3:
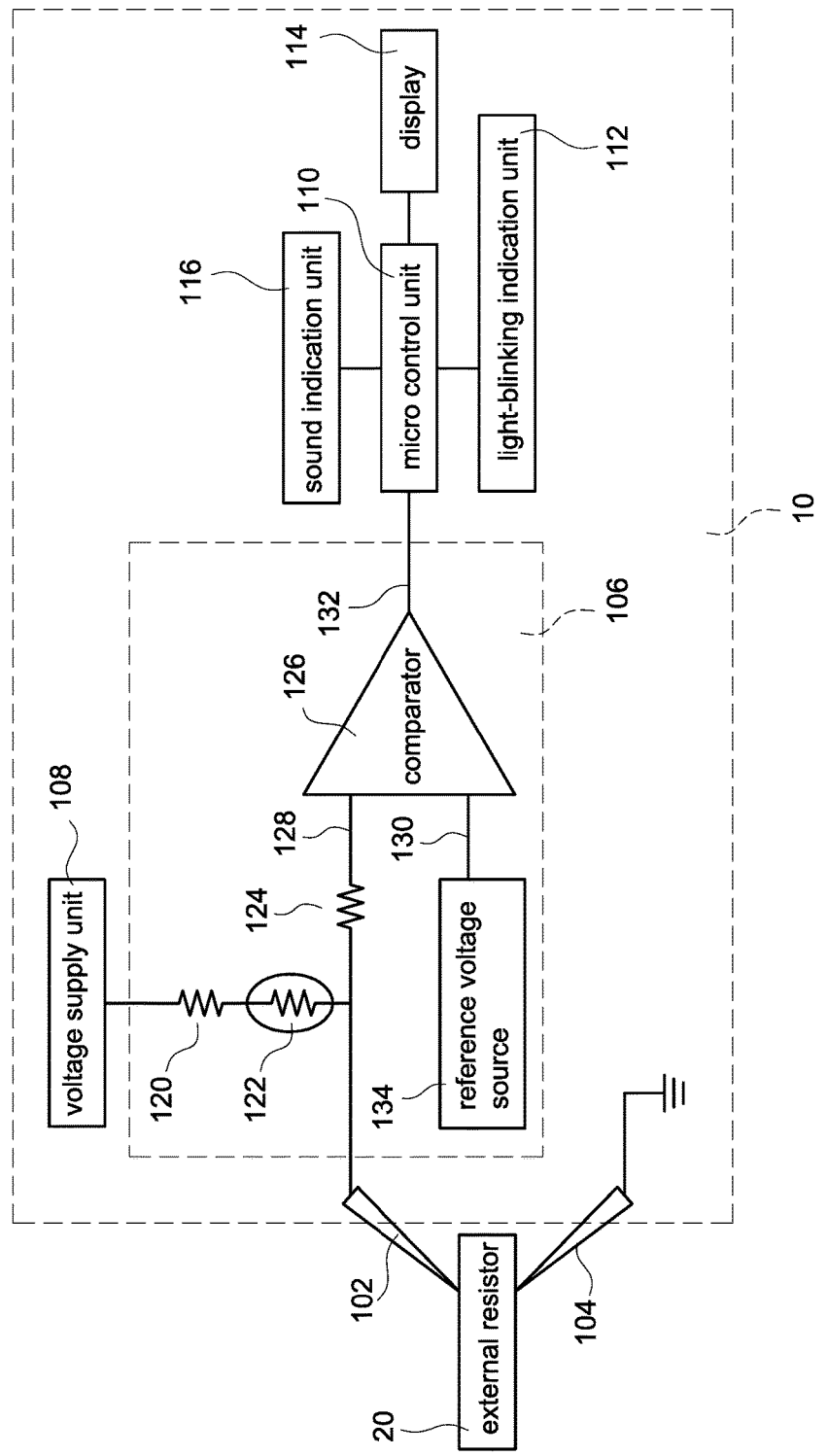
FIG. 3 shows a block diagram of the third embodiment of the electric meter apparatus with a light-blinking function of the present invention.

FIG. 3 shows a block diagram of the third embodiment of the electric meter apparatus with a light-blinking function of the present invention. The description for the elements shown in FIG. 3, which are similar to those shown in FIGS. 1~2, is not repeated here for brevity. Moreover, the electric meter apparatus 10 further comprises a sound indication unit 116 connected to the micro control unit 110. The sound indication unit 116 is a buzzer.

Figure 8:
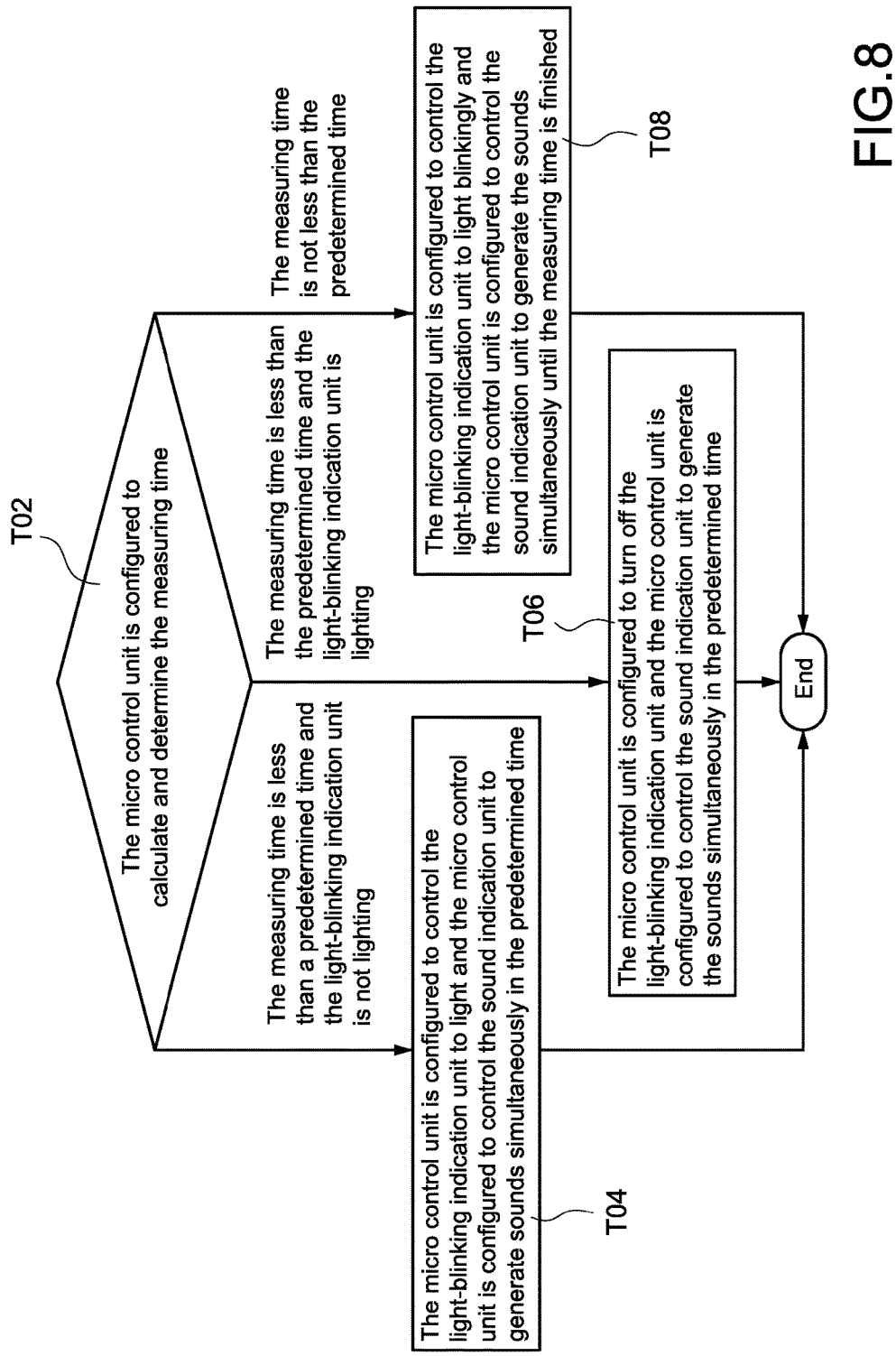
FIG. 8 shows a flow chart of the second embodiment of the measuring method applied to the electric meter apparatus with a light-blinking function of the present invention.

FIG. 8 shows a flow chart of the second embodiment of the measuring method applied to the electric meter apparatus with a light-blinking function of the present invention. Moreover, in an embodiment of the present invention, a measuring time is defined as a duration that the resistor measuring circuit 106 is configured to measure the external resistor 20 through the positive-side probe 102 and the negative-side probe 104 and the resistance value of the external resistor 20 is less than or equal to a predetermined value. As shown in FIG. 8, the measuring method applied to the electric meter apparatus of the present invention comprises following steps:

Step T02: The micro control unit 110 is configured to calculate and determine the measuring time. If the measuring time is less than a predetermined time (for example, one second) and the light-blinking indication unit 112 is not lighting, the measuring method goes to a step T04. If the measuring time is less than the predetermined time and the light-blinking indication unit 112 is lighting, the measuring method goes to a step T06. If the measuring time is not less than the predetermined time, the measuring method goes to a step T08.

Step T04: The micro control unit 110 is configured to control the light-blinking indication unit 112 to light and the micro control unit 110 is configured to control the sound indication unit 116 to generate sounds simultaneously in the predetermined time. Then the measuring method is finished.

Step T06: The micro control unit 110 is configured to turn off the light-blinking indication unit 112 and the micro control unit 110 is configured to control the sound indication unit 116 to generate the sounds simultaneously in the predetermined time. Then the measuring method is finished.

Step T08: The micro control unit 110 is configured to control the light-blinking indication unit 112 to light blinkingly and the micro control unit 110 is configured to control the sound indication unit 116 to generate the sounds simultaneously until the measuring time is finished. Then the measuring method is finished.

For example, the duration for the resistor measuring circuit 106 measuring the short circuit through the positive-side probe 102 and the negative-side probe 104 is 0.5 second, and then the resistor measuring circuit 106 stops measuring the short circuit through the positive-side probe 102 and the negative-side probe 104 (namely, the measuring time mentioned above is 0.5 second): If the light-blinking indication unit 112 is not lighting, the micro control unit 110 is configured to control the light-blinking indication unit 112 to light and the micro control unit 110 is configured to control the sound indication unit 116 to generate the sounds simultaneously in 0.5 second, and then the micro control unit 110 is configured to turn off the light-blinking indication unit 112 and the sound indication unit 116. If the light-blinking indication unit 112 is lighting, the micro control unit 110 is configured to turn off the light-blinking indication unit 112 and the micro control unit 110 is configured to control the sound indication unit 116 to generate the sounds simultaneously in 0.5 second, and then the micro control unit 110 is configured to control the light-blinking indication unit 112 to light and the micro control unit 110 is configured to turn off the sound indication unit 116.

For example, the duration for the resistor measuring circuit 106 measuring the short circuit through the positive-side probe 102 and the negative-side probe 104 is 5 seconds, and then the resistor measuring circuit 106 stops measuring the short circuit through the positive-side probe 102 and the negative-side probe 104 (namely, the measuring time mentioned above is 5 seconds): If the light-blinking indication unit 112 is not lighting, the micro control unit 110 is configured to control the light-blinking indication unit 112 to light and the micro control unit 110 is configured to control the sound indication unit 116 to generate the sounds simultaneously in the first second, and then the micro control unit 110 is configured to control the light-blinking indication unit 112 to light blinkingly and the micro control unit 110 is configured to control the sound indication unit 116 to generate the sounds simultaneously in the second to fifth seconds, and then the micro control unit 110 is configured to turn off the light-blinking indication unit 112 and the sound indication unit 116 after the fifth second. If the light-blinking indication unit 112 is lighting, the micro control unit 110 is configured to turn off the light-blinking indication unit 112 and the micro control unit 110 is configured to control the sound indication unit 116 to generate the sounds simultaneously in the first second, and the micro control unit 110 is configured to control the light-blinking indication unit 112 to light blinkingly and the micro control unit 110 is configured to control the sound indication unit 116 to generate the sounds simultaneously in the second to fifth seconds, and then the micro control unit 110 is configured to control the light-blinking indication unit 112 to light and the micro control unit 110 is configured to turn off the sound indication unit 116 after the fifth second.

Figure 4:
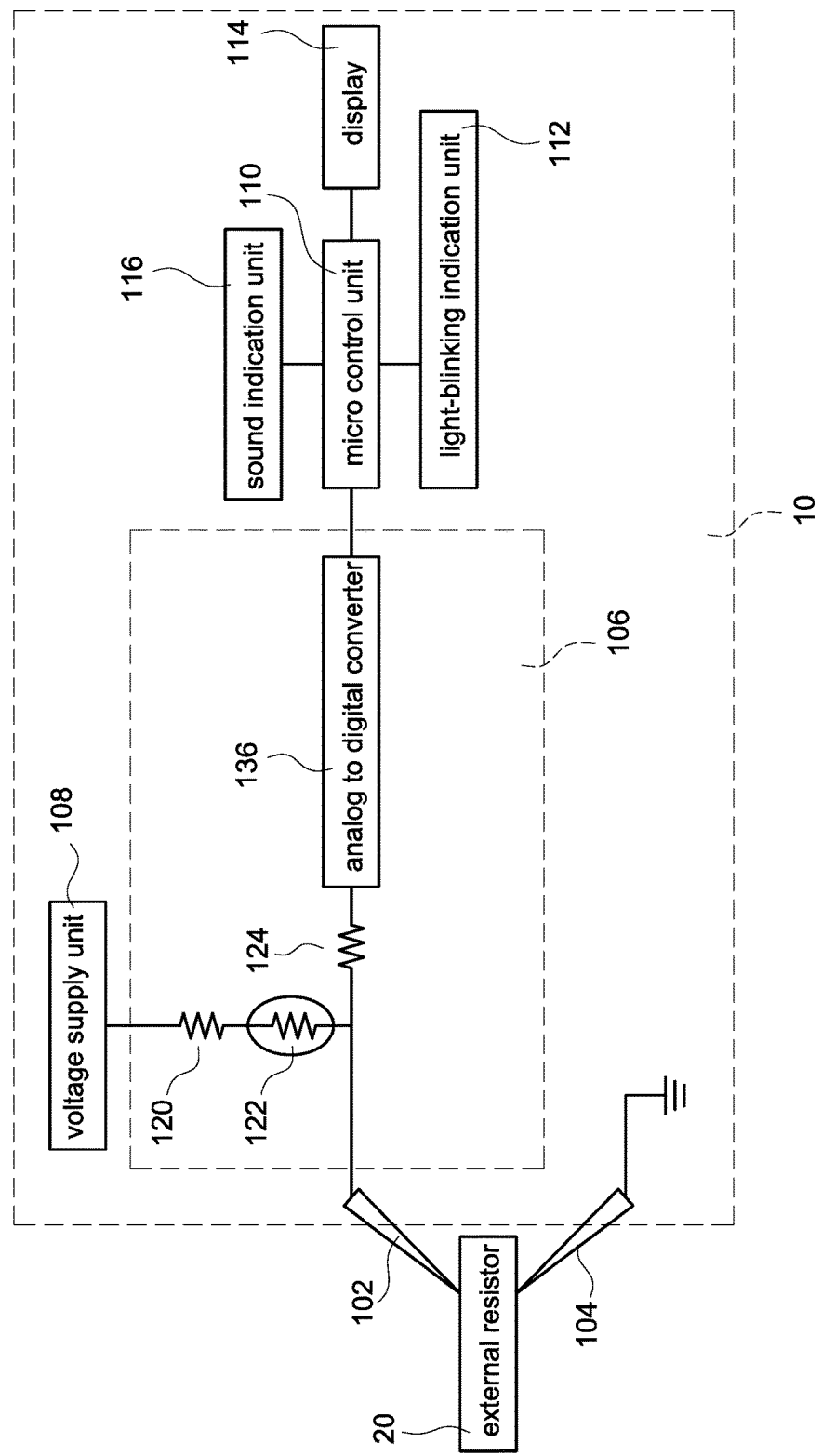
FIG. 4 shows a block diagram of the fourth embodiment of the electric meter apparatus with a light-blinking function of the present invention.

FIG. 4 shows a block diagram of the fourth embodiment of the electric meter apparatus with a light-blinking function of the present invention. The description for the elements shown in FIG. 4, which are similar to those shown in FIGS. 1~3, is not repeated here for brevity. If the resistance value of the external resistor 20 is less than or equal to the predetermined value, the analog to digital converter 136 is configured to inform the micro control unit 110 that the resistance value of the external resistor 20 is less than or equal to the predetermined value.

Figure 5:
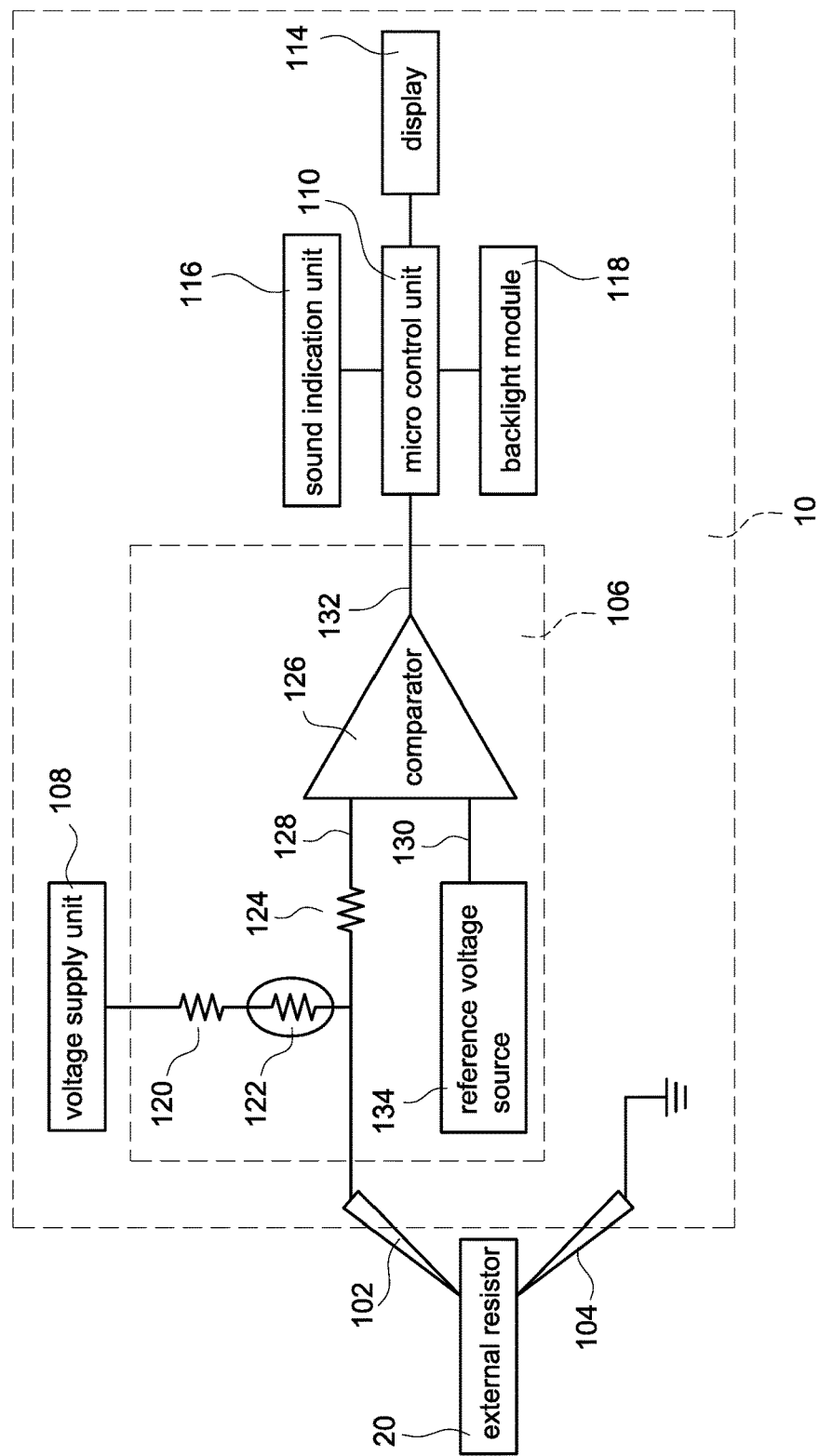
FIG. 5 shows a block diagram of the fifth embodiment of the electric meter apparatus with a light-blinking function of the present invention.

FIG. 5 shows a block diagram of the fifth embodiment of the electric meter apparatus with a light-blinking function of the present invention. The description for the elements shown in FIG. 5, which are similar to those shown in FIGS. 1~4, is not repeated here for brevity. Moreover, the electric meter apparatus 10 further comprises a backlight module 118 connected to the micro control unit 110.

Figure 9:
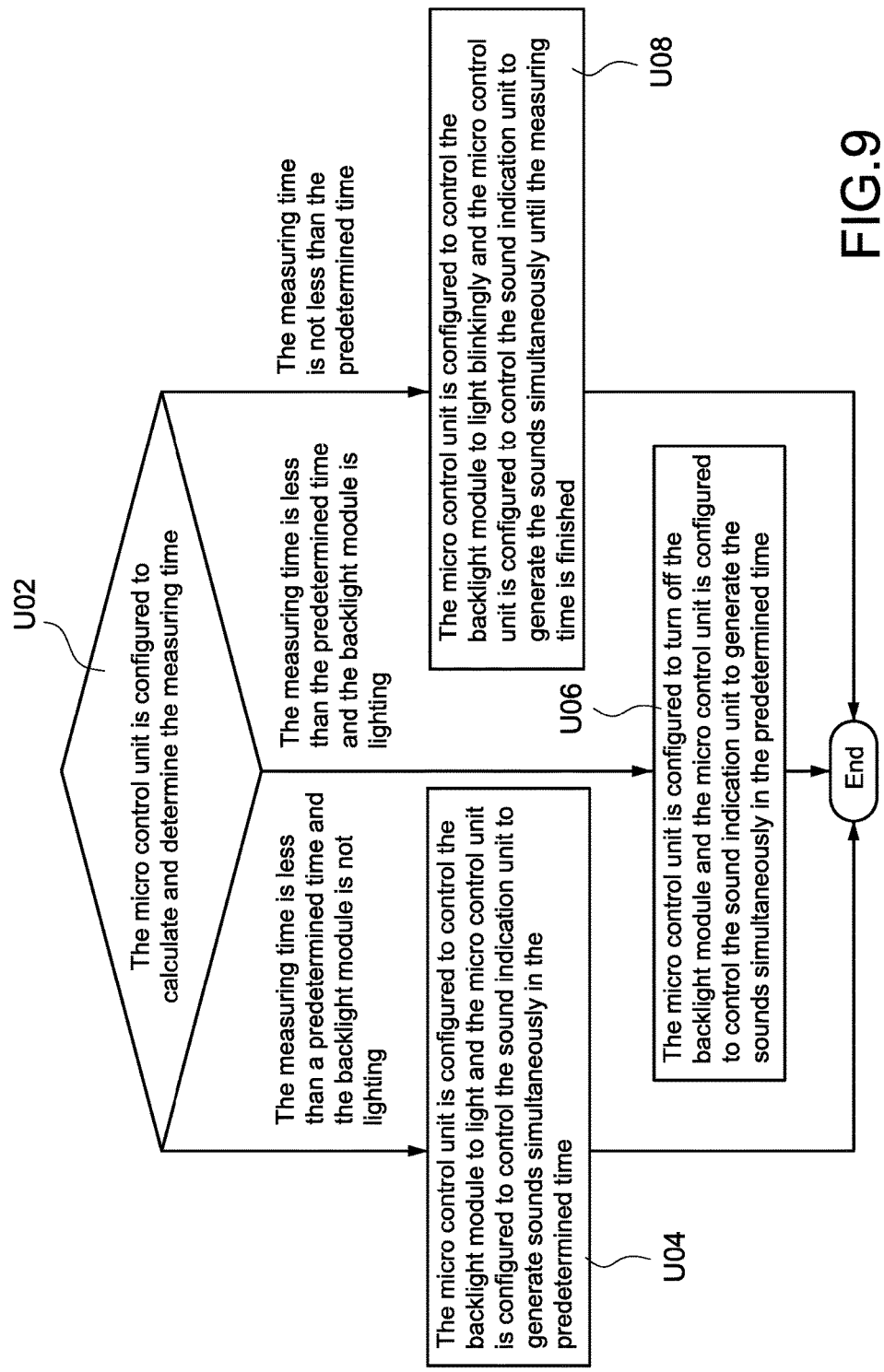
FIG. 9 shows a flow chart of the third embodiment of the measuring method applied to the electric meter apparatus with a light-blinking function of the present invention.

FIG. 9 shows a flow chart of the third embodiment of the measuring method applied to the electric meter apparatus with a light-blinking function of the present invention. Moreover, in an embodiment of the present invention, a measuring time is defined as a duration that the resistor measuring circuit 106 is configured to measure the external resistor 20 through the positive-side probe 102 and the negative-side probe 104 and the resistance value of the external resistor 20 is less than or equal to a predetermined value. As shown in FIG. 9, the measuring method applied to the electric meter apparatus of the present invention comprises following steps:

Step U02: The micro control unit 110 is configured to calculate and determine the measuring time. If the measuring time is less than a predetermined time (for example, one second) and the backlight module 118 is not lighting, the measuring method goes to a step U04. If the measuring time is less than the predetermined time and the backlight module 118 is lighting, the measuring method goes to a step U06. If the measuring time is not less than the predetermined time, the measuring method goes to a step U08.

Step U04: The micro control unit 110 is configured to control the backlight module 118 to light and the micro control unit 110 is configured to control the sound indication unit 116 to generate sounds simultaneously in the predetermined time. Then the measuring method is finished.

Step U06: The micro control unit 110 is configured to turn off the backlight module 118 and the micro control unit 110 is configured to control the sound indication unit 116 to generate the sounds simultaneously in the predetermined time. Then the measuring method is finished.

Step U08: The micro control unit 110 is configured to control the backlight module 118 to light blinkingly and the micro control unit 110 is configured to control the sound indication unit 116 to generate the sounds simultaneously until the measuring time is finished. Then the measuring method is finished.

For example, the duration for the resistor measuring circuit 106 measuring the short circuit through the positive-side probe 102 and the negative-side probe 104 is 0.5 second, and then the resistor measuring circuit 106 stops measuring the short circuit through the positive-side probe 102 and the negative-side probe 104 (namely, the measuring time mentioned above is 0.5 second): If the backlight module 118 is not lighting, the micro control unit 110 is configured to control the backlight module 118 to light and the micro control unit 110 is configured to control the sound indication unit 116 to generate the sounds simultaneously in 0.5 second, and then the micro control unit 110 is configured to turn off the backlight module 118 and the sound indication unit 116. If the backlight module 118 is lighting, the micro control unit 110 is configured to turn off the backlight module 118 and the micro control unit 110 is configured to control the sound indication unit 116 to generate the sounds simultaneously in 0.5 second, and then the micro control unit 110 is configured to control the backlight module 118 to light and the micro control unit 110 is configured to turn off the sound indication unit 116.

For example, the duration for the resistor measuring circuit 106 measuring the short circuit through the positive-side probe 102 and the negative-side probe 104 is 5 seconds, and then the resistor measuring circuit 106 stops measuring the short circuit through the positive-side probe 102 and the negative-side probe 104 (namely, the measuring time mentioned above is 5 seconds): If the backlight module 118 is not lighting, the micro control unit 110 is configured to control the backlight module 118 to light and the micro control unit 110 is configured to control the sound indication unit 116 to generate the sounds simultaneously in the first second, and then the micro control unit 110 is configured to control the backlight module 118 to light blinkingly and the micro control unit 110 is configured to control the sound indication unit 116 to generate the sounds simultaneously in the second to fifth seconds, and then the micro control unit 110 is configured to turn off the backlight module 118 and the sound indication unit 116 after the fifth second. If the backlight module 118 is lighting, the micro control unit 110 is configured to turn off the backlight module 118 and the micro control unit 110 is configured to control the sound indication unit 116 to generate the sounds simultaneously in the first second, and the micro control unit 110 is configured to control the backlight module 118 to light blinkingly and the micro control unit 110 is configured to control the sound indication unit 116 to generate the sounds simultaneously in the second to fifth seconds, and then the micro control unit 110 is configured to control the backlight module 118 to light and the micro control unit 110 is configured to turn off the sound indication unit 116 after the fifth second.

Figure 6:
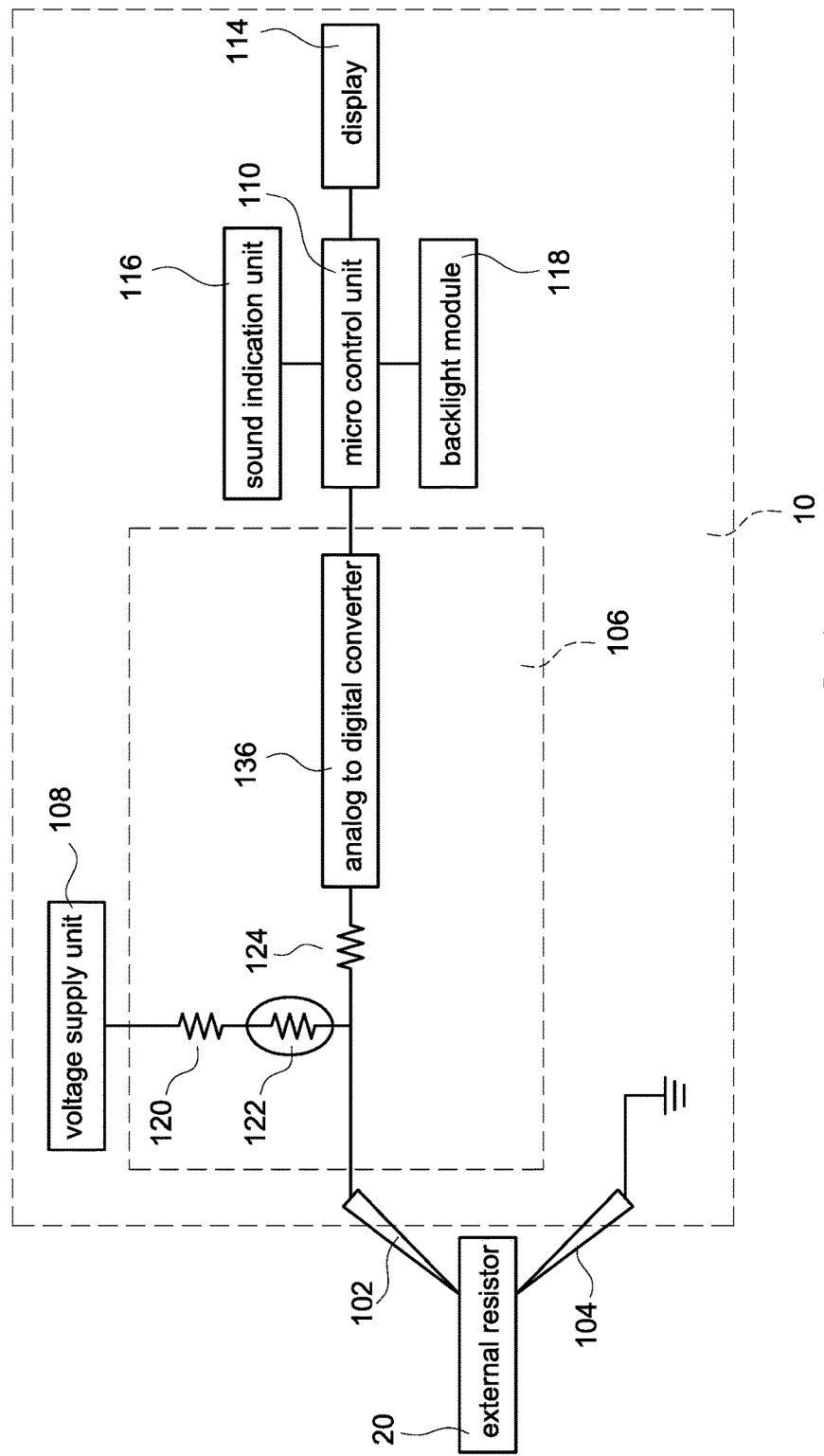
FIG. 6 shows a block diagram of the sixth embodiment of the electric meter apparatus with a light-blinking function of the present invention.

FIG. 6 shows a block diagram of the sixth embodiment of the electric meter apparatus with a light-blinking function of the present invention. The description for the elements shown in FIG. 6, which are similar to those shown in FIGS. 1~5, is not repeated here for brevity. If the resistance value of the external resistor 20 is less than or equal to the predetermined value, the analog to digital converter 136 is configured to inform the micro control unit 110 that the resistance value of the external resistor 20 is less than or equal to the predetermined value.

Figure 10:
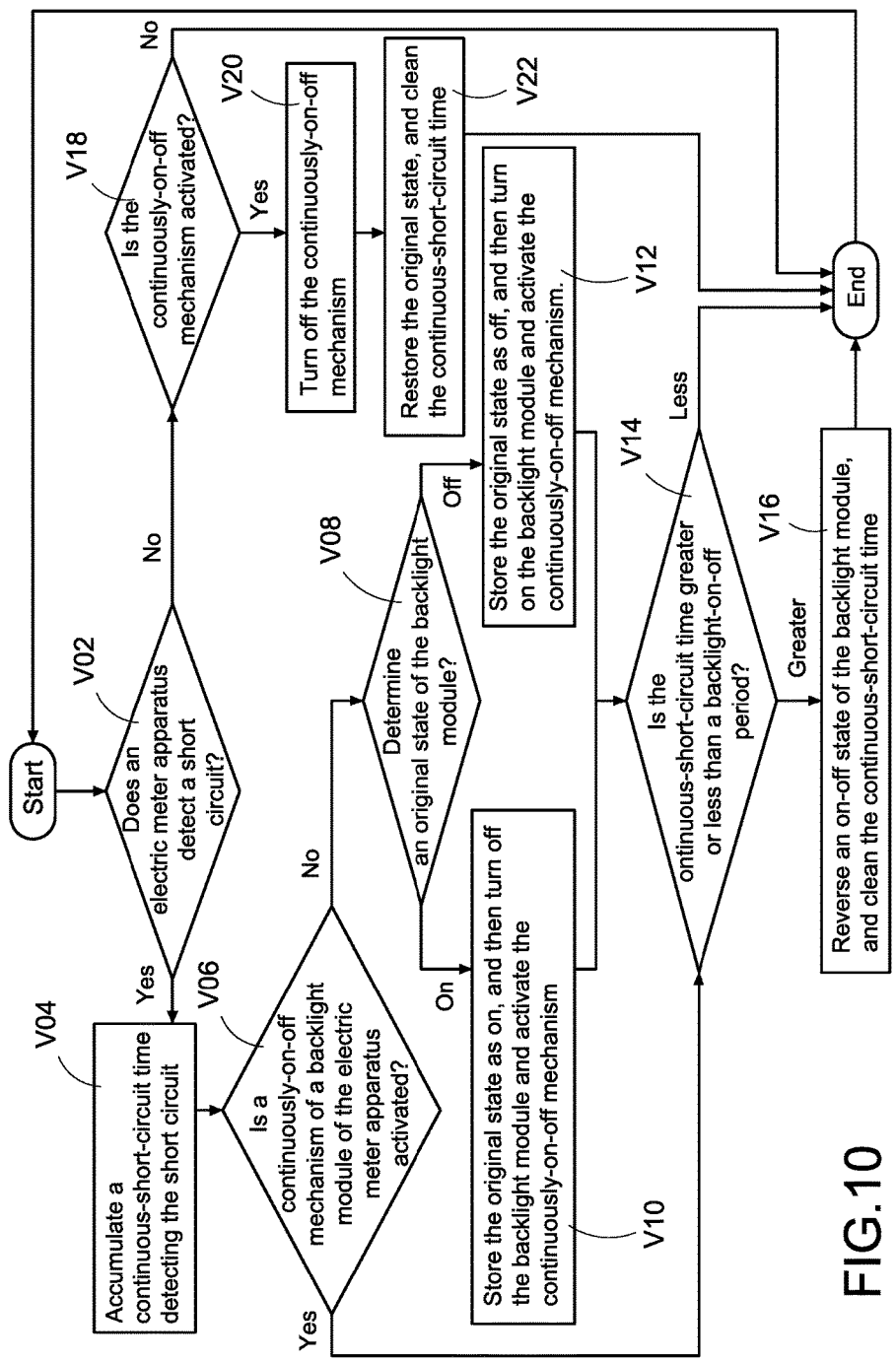
FIG. 10 shows a flow chart of the blinking method of the electric meter apparatus of the present invention.

FIG. 10 shows a flow chart of the blinking method of the electric meter apparatus of the present invention. FIG. 10 is a more detailed flow chart of FIGS. 7~9. The blinking method of the electric meter apparatus comprises following steps:

Step V02: Does an electric meter apparatus detect a short circuit? If yes, the blinking method goes to a step V04. If no, the blinking method goes to a step V18.

Step V04: Accumulate a continuous-short-circuit time detecting the short circuit. Then the blinking method goes to a step V06. Moreover, if a timer of the electric meter apparatus receives an interrupt flag, the timer accumulates the continuous-short-circuit time.

Step V06: Is a continuously-on-off mechanism of a backlight module of the electric meter apparatus activated? If yes, the blinking method goes to a step V14. If no, the blinking method goes to the step V18. Moreover, the continuously-on-off mechanism indicates that the backlight module is continuously on and off.

Step V08: Determine an original state of the backlight module. If the original state is on (namely, lighting), the blinking method goes to a step V10. If the original state is off (namely, not lighting), the blinking method goes to a step V12.

Step V10: Store the original state as on, and then turn off the backlight module and activate the continuously-on-off mechanism. Then the blinking method goes to a step V14.

Step V12: Store the original state as off, and then turn on the backlight module and activate the continuously-on-off mechanism. Then the blinking method goes to the step V14.

Step V14: Perform a continuous-short-circuit time determination mechanism. In the continuous-short-circuit time determination mechanism, determinate whether the continuous-short-circuit time is greater or less than a backlight-on-off period. If the continuous-short-circuit time is greater than the backlight-on-off period, the blinking method goes to a step V16. If the continuous-short-circuit time is less than the backlight-on-off period, the blinking method is finished, and then the blinking method is re-started. Moreover, the backlight-on-off period is a time that the backlight module is on for one time and off for one time. The backlight-on-off period can be set as 128 ms, 256 ms or 512 ms.

Step V16: Reverse an on-off state of the backlight module (namely, if the backlight module is lighting, the backlight module will be turned off; if the backlight module is not lighting, the backlight module will be turned on), and clean the continuous-short-circuit time. Then the blinking method is finished, and then the blinking method is re-started.

Step V18: Is the continuously-on-off mechanism activated? If yes, the blinking method goes to a step V20. If no, the blinking method is finished, and then the blinking method is re-started.

Step V20: Turn off the continuously-on-off mechanism. Then the blinking method goes to a step V22.

Step V22: Restore the original state, and clean the continuous-short-circuit time. Then the blinking method is finished, and then the blinking method is re-started.

The advantage of the present invention is that when the short circuit is measured by the electric meter, the backlight module or the light emitting diode of the electric meter will light blinkingly to remind the user.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An electric meter apparatus applied to an external resistor, the electric meter apparatus comprising:
   a positive-side probe, one side of the positive-side probe connected to one side of the external resistor;
   a negative-side probe, one side of the negative-side probe connected to the other side of the external resistor, the other side of the negative-side probe connected to ground;
   a resistor measuring circuit connected to the other side of the positive-side probe;
   a voltage supply unit connected to the resistor measuring circuit;
   a micro control unit connected to the resistor measuring circuit; and
   a light-blinking indication unit connected to the micro control unit,
   wherein the resistor measuring circuit is configured to measure the external resistor to obtain a resistance value of the external resistor through the positive-side probe and the negative-side probe; the resistor measuring circuit is configured to inform the micro control unit of the resistance value of the external resistor; a measuring time is defined as a duration that the resistor measuring circuit is configured to measure the external resistor through the positive-side probe and the negative-side probe and the resistance value of the external resistor is less than or equal to a predetermined value; the micro control unit is configured to calculate and determine the measuring time;
   wherein if the measuring time is less than a predetermined time and the light-blinking indication unit is not lighting, the micro control unit is configured to control the light-blinking indication unit to light in the predetermined time; if the measuring time is less than the predetermined time and the light-blinking indication unit is lighting, the micro control unit is configured to turn off the light-blinking indication unit in the predetermined time; if the measuring time is not less than the predetermined time, the micro control unit is configured to control the light-blinking indication unit to light blinkingly.

2. The electric meter apparatus in claim 1 further comprising:
   a display connected to the micro control unit,
   wherein the light-blinking indication unit is a backlight module.

3. The electric meter apparatus in claim 2, wherein the light-blinking indication unit is a light emitting diode.

4. The electric meter apparatus in claim 3, wherein the resistor measuring circuit includes:
   a first voltage-dividing resistor, one side of the first voltage-dividing resistor connected to the voltage supply unit;
   a positive temperature coefficient thermistor unit, one side of the positive temperature coefficient thermistor unit connected to the other side of the first voltage-dividing resistor, the other side of the positive temperature coefficient thermistor unit connected to the other side of the positive-side probe;
   a measuring side resistor, one side of the measuring side resistor connected to the other side of the positive-side probe and the other side of the positive temperature coefficient thermistor unit;
   a comparator; and
   a reference voltage source,
   wherein the comparator includes:
   a first input side connected to the other side of the measuring side resistor;
   a second input side connected to the reference voltage source; and
   an output side connected to the micro control unit,
   wherein if the resistance value of the external resistor is less than or equal to the predetermined value, the comparator is configured to inform the micro control unit that the resistance value of the external resistor is less than or equal to the predetermined value.

5. An electric meter apparatus applied to an external resistor, the electric meter apparatus comprising:

a positive-side probe, one side of the positive-side probe connected to one side of the external resistor;

a negative-side probe, one side of the negative-side probe connected to the other side of the external resistor, the other side of the negative-side probe connected to ground;

a resistor measuring circuit connected to the other side of the positive-side probe;

a voltage supply unit connected to the resistor measuring circuit;

a micro control unit connected to the resistor measuring circuit;

a light-blinking indication unit connected to the micro control unit; and a sound indication unit connected to the micro control unit, wherein the resistor measuring circuit is configured to measure the external resistor to obtain a resistance value of the external resistor through the positive-side probe and the negative-side probe; the resistor measuring circuit is configured to inform the micro control unit of the resistance value of the external resistor; a measuring time is defined as a duration that the resistor measuring circuit is configured to measure the external resistor through the positive-side probe and the negative-side probe and the resistance value of the external resistor is less than or equal to a predetermined value; the micro control unit is configured to calculate and determine the measuring time;

wherein if the measuring time is less than a predetermined time and the light-blinking indication unit is not lighting, the micro control unit is configured to control the light-blinking indication unit to light and the micro control unit is configured to control the sound indication unit to generate sounds simultaneously in the predetermined time; if the measuring time is less than the predetermined time and the light-blinking indication unit is lighting, the micro control unit is configured to turn off the light-blinking indication unit and the micro control unit is configured to control the sound indication unit to generate the sounds simultaneously in the predetermined time; if the measuring time is not less than the predetermined time, the micro control unit is configured to control the light-blinking indication unit to light blinkingly and the micro control unit is configured to control the sound indication unit to generate the sounds simultaneously.

6. The electric meter apparatus in claim 5 further comprising:

a display connected to the micro control unit, wherein the light-blinking indication unit is a backlight module.

7. The electric meter apparatus in claim 6, wherein the light-blinking indication unit is a light emitting diode.

8. The electric meter apparatus in claim 7, wherein the sound indication unit is a buzzer.

9. The electric meter apparatus in claim 8, wherein the resistor measuring circuit includes:

a first voltage-dividing resistor, one side of the first voltage-dividing resistor connected to the voltage supply unit;

a positive temperature coefficient thermistor unit, one side of the positive temperature coefficient thermistor unit connected to the other side of the first voltage-dividing resistor, the other side of the positive temperature coefficient thermistor unit connected to the other side of the positive-side probe;

a measuring side resistor, one side of the measuring side resistor connected to the other side of the positive-side probe and the other side of the positive temperature coefficient thermistor unit;

a comparator; and a reference voltage source, wherein the comparator includes:

a first input side connected to the other side of the measuring side resistor;

a second input side connected to the reference voltage source; and an output side connected to the micro control unit, wherein if the resistance value of the external resistor is less than or equal to the predetermined value, the comparator is configured to inform the micro control unit that the resistance value of the external resistor is less than or equal to the predetermined value.

10. An electric meter apparatus applied to an external resistor, the electric meter apparatus comprising:

a positive-side probe, one side of the positive-side probe connected to one side of the external resistor;

a negative-side probe, one side of the negative-side probe connected to the other side of the external resistor, the other side of the negative-side probe connected to ground;

a resistor measuring circuit connected to the other side of the positive-side probe;

a voltage supply unit connected to the resistor measuring circuit;

a micro control unit connected to the resistor measuring circuit;

a backlight module connected to the micro control unit; and a sound indication unit connected to the micro control unit, wherein the resistor measuring circuit is configured to measure the external resistor to obtain a resistance value of the external resistor through the positive-side probe and the negative-side probe; the resistor measuring circuit is configured to inform the micro control unit of the resistance value of the external resistor; a measuring time is defined as a duration that the resistor measuring circuit is configured to measure the external resistor through the positive-side probe and the negative-side probe and the resistance value of the external resistor is less than or equal to a predetermined value; the micro control unit is configured to calculate and determine the measuring time;

wherein if the measuring time is less than a predetermined time and the backlight module is not lighting, the micro control unit is configured to control the backlight module to light and the micro control unit is configured to control the sound indication unit to generate sounds simultaneously in the predetermined time; if the measuring time is less than the predetermined time and the backlight module is lighting, the micro control unit is configured to turn off the backlight module and the micro control unit is configured to control the sound indication unit to generate the sounds simultaneously in the predetermined time; if the measuring time is not less than the predetermined time, the micro control unit is configured to control the backlight module to light blinkingly and the micro control unit is configured to control the sound indication unit to generate the sounds simultaneously.

11. The electric meter apparatus in claim 10 further comprising:

a display connected to the micro control unit.

12. The electric meter apparatus in claim 11, wherein the sound indication unit is a buzzer.

13. The electric meter apparatus in claim 12, wherein the resistor measuring circuit includes:
- a first voltage-dividing resistor, one side of the first voltage-dividing resistor connected to the voltage supply unit;
- a positive temperature coefficient thermistor unit, one side of the positive temperature coefficient thermistor unit connected to the other side of the first voltage-dividing resistor, the other side of the positive temperature coefficient thermistor unit connected to the other side of the positive-side probe;
- a measuring side resistor, one side of the measuring side resistor connected to the other side of the positive-side probe and the other side of the positive temperature coefficient thermistor unit;
- a comparator; and
- a reference voltage source, wherein the comparator includes:
- a first input side connected to the other side of the measuring side resistor;
- a second input side connected to the reference voltage source; and
- an output side connected to the micro control unit,
- wherein if the resistance value of the external resistor is less than or equal to the predetermined value, the comparator is configured to inform the micro control unit that the resistance value of the external resistor is less than or equal to the predetermined value.

* * * * *

UNITED STATES PATENT AND TRADEMARK OFFICE
CERTIFICATE OF CORRECTION

PATENT NO. : 10,008,094 B2
APPLICATION NO. : 15/684944
DATED : June 26, 2018
INVENTOR(S) : Po-Chao Tan Page 1 of 1

It is certified that error appears in the above-identified patent and that said Letters Patent is hereby corrected as shown below:

On the Title Page

Item (63) should be corrected as below:
Continuation-in-part of application No. 15/218,235 filed on Jul. 25, 2016, now abandoned.

Signed and Sealed this
Twenty-third Day of October, 2018

Andrei Iancu
*Director of the United States Patent and Trademark Office*